(12) United States Patent
Zhang et al.

(10) Patent No.: US 10,937,817 B2
(45) Date of Patent: Mar. 2, 2021

(54) ARRAY SUBSTRATE COMPRISING CURVED CAPACITORS

(71) Applicant: BOE TECHNOLOGY GROUP CO., LTD., Beijing (CN)

(72) Inventors: Baoxia Zhang, Beijing (CN); Cuili Gai, Beijing (CN); Ling Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 12 days.

(21) Appl. No.: 16/146,155

(22) Filed: Sep. 28, 2018

(65) Prior Publication Data

US 2019/0103422 A1   Apr. 4, 2019

(30) Foreign Application Priority Data

Sep. 30, 2017   (CN) .......................... 201710919671.1

(51) Int. Cl.
*H01L 27/12* (2006.01)
*H01L 49/02* (2006.01)
*H01L 27/32* (2006.01)

(52) U.S. Cl.
CPC ...... *H01L 27/1255* (2013.01); *H01L 27/1259* (2013.01); *H01L 27/3244* (2013.01); *H01L 28/88* (2013.01)

(58) Field of Classification Search
CPC ............. H01L 27/1255; H01L 27/3244; H01L 27/1259; H01L 28/88; H01L 28/82–92
See application file for complete search history.

(56) References Cited

U.S. PATENT DOCUMENTS

| | | | | |
|---|---|---|---|---|
| 9,698,214 | B1* | 7/2017 | Lu ........................ | H01L 23/5223 |
| 2001/0053576 | A1* | 12/2001 | DeBoer ................... | H01L 28/91 |
| | | | | 438/239 |
| 2014/0008111 | A1* | 1/2014 | Kuo ..................... | H01L 23/5223 |
| | | | | 174/257 |
| 2014/0246652 | A1* | 9/2014 | Abraham ................ | H01L 27/18 |
| | | | | 257/31 |
| 2015/0028450 | A1* | 1/2015 | Park ....................... | H01L 23/481 |
| | | | | 257/532 |
| 2016/0322401 | A1* | 11/2016 | Zhang ................... | H01L 27/124 |

* cited by examiner

*Primary Examiner* — Allen L Parker
*Assistant Examiner* — Gustavo G Ramallo
(74) *Attorney, Agent, or Firm* — Nath, Goldberg & Meyer; Joshua B. Goldberg

(57) ABSTRACT

An array substrate is provided. The array substrate includes a capacitor, which includes a plurality of metal electrodes arranged opposite to each other. The plurality of metal electrodes are spaced apart from each other in a horizontal direction parallel to a plane in which the array substrate is located, and an orthogonal projection of each of at least two of the plurality of metal electrodes of the capacitor on the plane in which the array substrate is located includes a curved portion.

20 Claims, 3 Drawing Sheets

ARRAY SUBSTRATE COMPRISING CURVED CAPACITORS

CROSS-REFERENCE TO RELATED APPLICATIONS

The present application claims the priority of Chinese Patent Application No. 201710919671.1, filed on Sep. 30, 2017, the contents of which are incorporated herein in their entirety by reference.

TECHNICAL FIELD

The present disclosure relates to the field of display technology, and in particular, relates to an array substrate, a method for manufacturing the same, and a display device.

BACKGROUND

It is known that the capacitance of a capacitor not only affects an aperture ratio and a charging rate of a display device, but also is a key factor on which a lifespan of the display device depends. Thus, in a layout design of a display device in the related art, the capacitance of a capacitor is a parameter to be considered carefully. Therefore, it attracts more and more attention to increase the capacitance of a capacitor of an array substrate while reducing a space occupied by the capacitor.

SUMMARY

Embodiments of the present disclosure provide an array substrate, a method for manufacturing the same, and a display device.

Some embodiments of the present disclosure provide an array substrate including a capacitor, wherein the capacitor includes a plurality of metal electrodes arranged opposite to each other, the plurality of metal electrodes are spaced apart from each other in a horizontal direction parallel to a plane in which the array substrate is located, and an orthogonal projection of each of at least two of the plurality of metal electrodes of the capacitor on the plane in which the array substrate is located includes a curved portion.

In an embodiment, the capacitor further includes at least one insulation layer, and any adjacent two of the plurality of metal electrodes are spaced apart from each other by one of the at least one insulation layer.

In an embodiment, orthogonal projections of the at least two of the plurality of metal electrodes of the capacitor on the plane in which the array substrate is located have spiral shapes.

In an embodiment, the orthogonal projections of the at least two of the plurality of metal electrodes of the capacitor on the plane in which the array substrate is located have conformal spiral shapes.

In an embodiment, the curved portion includes a plurality of finger-shaped portions spaced apart from each other and a connecting portion for connecting any adjacent two of the plurality of finger-shaped portions to each other, the at least two metal electrodes include a first metal electrode and a second metal electrode, and the plurality of finger-shaped portions of the first metal electrode and the plurality of finger-shaped portions of the second metal electrode are arranged alternately.

In an embodiment, both each of the plurality of finger-shaped portions and each connecting portion are strip-shaped.

In an embodiment, the array substrate further includes a thin film transistor which includes a gate, wherein the gate and the plurality of metal electrodes of the capacitor are located in a same layer, and in a direction perpendicular to the plane in which the array substrate is located, each of the plurality of metal electrodes has a size larger than that of the gate.

In an embodiment, the array substrate further includes a thin film transistor which includes a drain and a source, wherein the drain and/or source and the plurality of metal electrodes of the capacitor are located in a same layer, and in a direction perpendicular to the plane in which the array substrate is located, each of the plurality of metal electrodes has a size larger than that of the drain or the source.

In an embodiment, an orthogonal projection of the capacitor on the plane in which the array substrate is located has an area of S1, and a sum of all of areas by each of which any adjacent two of the plurality of metal electrodes of the capacitor overlap with each other is S2, where S1<S2.

In an embodiment, a direction parallel to the plane in which the array substrate is located is a thickness-wise direction of each of the metal electrodes, a direction perpendicular to the plane in which the array substrate is located is a lengthwise direction of each of the metal electrodes, each of the metal electrodes has a thickness of D1, and each of the metal electrodes has a length of L1, where D1<L1.

In an embodiment, sub-capacitors each of which is formed by any adjacent two of the plurality of metal electrodes of the capacitor are connected in parallel.

Some embodiments of the present disclosure provide a display device, which includes the array substrate provided by any one of the embodiments of the present disclosure.

Some embodiments of the present disclosure provide a method for manufacturing an array substrate. The method includes a step of forming a capacitor, so that the capacitor includes a plurality of metal electrodes arranged opposite to each other, the plurality of metal electrodes are spaced apart from each other in a horizontal direction parallel to a plane in which the array substrate is located, and an orthogonal projection of each of at least two ones of the plurality of metal electrodes of the capacitor on the plane in which the array substrate is located includes a curved portion.

In an embodiment, the capacitor further includes at least one insulation layer, and any adjacent two of the plurality of metal electrodes are spaced apart from each other by one of the at least one insulation layer.

In an embodiment, the step of forming a capacitor includes:

a step S1A of forming a metal layer;

a step S2A of etching the metal layer to form the plurality of metal electrodes; and a step S3A of forming the insulation layer between any adjacent two of the plurality of metal electrodes.

In an embodiment, the step S3A includes a step of coating an insulation material on either or both of two opposite surfaces of any adjacent two of the plurality of metal electrodes to form the insulation layer.

In an embodiment, the step of forming a capacitor includes:

a step S1B of forming the insulation layer;

a step S2B of etching the insulation layer to form a groove;

a step S3B of forming a metal layer in the groove; and a step S4B of removing a portion of the metal layer that is located outside of the groove to form each of the metal electrodes.

In an embodiment, the step S2B includes etching two opposite sides of the insulation layer to form two opposite grooves spaced apart from each other.

In an embodiment, the step S3B includes forming metal layers in two opposite grooves of the insulation layer, respectively.

In an embodiment, the step S4B includes removing a portion of the metal layer that is located outside of each of two opposite grooves of the insulation layer to form two adjacent metal electrodes spaced apart from each other by the insulation layer.

BRIEF DESCRIPTION OF THE DRAWINGS

The above and/or additional aspects and advantages of the present disclosure will be apparent and easily understood from the following description of embodiments made in conjunction with the accompanying drawings, wherein.

DETAILED DESCRIPTION

Figure 1:
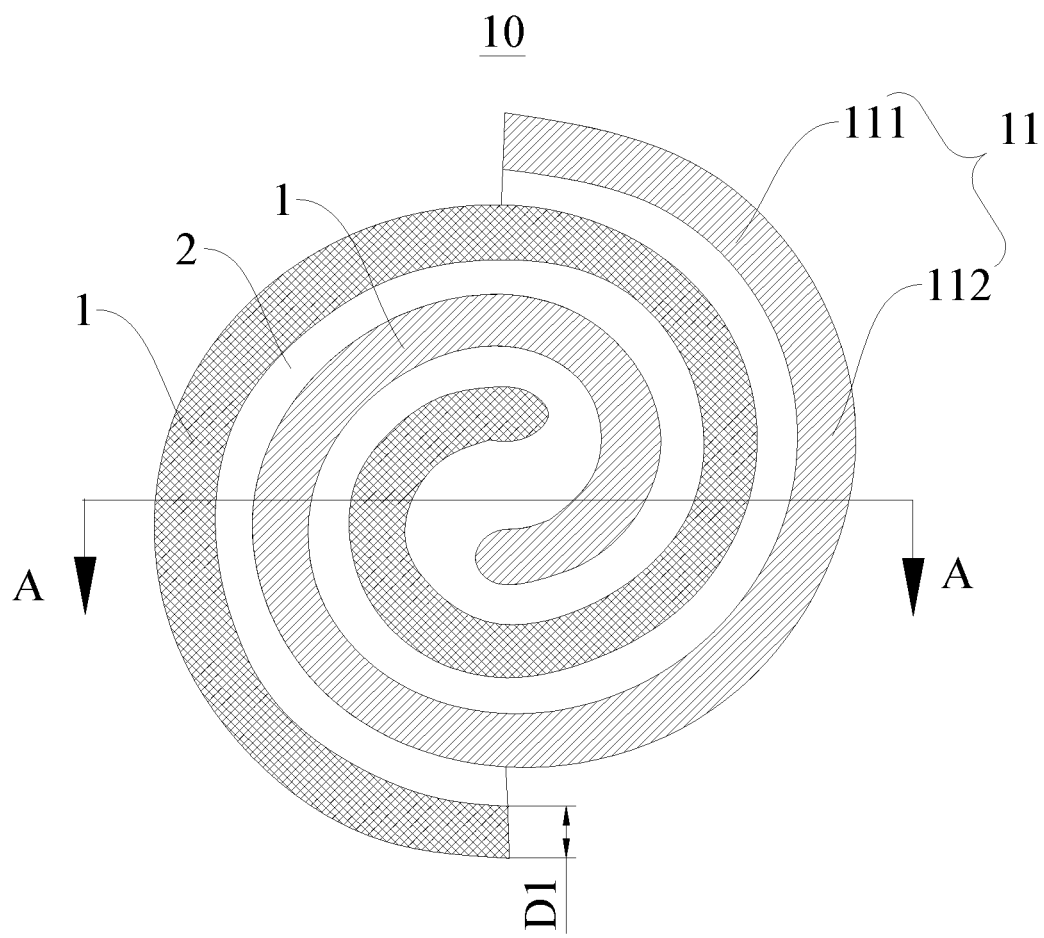
FIG. 1 is a schematic diagram showing a capacitor according to an embodiment of the present disclosure.

Embodiments of the present disclosure will be described in detail below, and examples of the embodiments are illustrated in the accompanying drawings. A same or similar reference numeral denotes a same or similar element or an element having a same or similar function throughout the description. The embodiments described herein with reference to the accompanying drawings are illustrative and only for the purpose of explaining the present disclosure, and should not be construed as limiting the present disclosure.

It should be understood that, in the description of the present disclosure, an orientation or a positional relationship indicated by a term such as "center", "longitudinal", "lateral", "length", "width", "thickness", "upper", "lower", "front", "rear", "left", "right", "vertical", "horizontal", "top", "bottom", "inner", "outside", "clockwise", "counterclockwise", "axial direction", "radial direction", "circumferential direction", or the like is the orientation or the positional relationship based on the orientation or positional relationship shown in the drawings, and is merely for the convenience of describing the present disclosure and for simplifying the description, rather than indicating or implying the indicated device or element must have a particular orientation, or must be constructed and operated in a particular orientation, and thus should not be construed as limiting the present disclosure. Further, terms such as "first", "second", and the like are only used for distinguishing one feature from another feature. For example, a same feature may be referred to as a first feature in an embodiment, and may be referred to as a second feature in another embodiment. In the description of the present disclosure, the phrase "a plurality of" means two or more unless otherwise indicated.

It should be noted that, in the description of the present disclosure, the terms such as "install", "connect", "bond", and the like should be construed broadly unless otherwise explicitly indicated and defined. For example, depending on practical applications, the term "connect" may mean a fixed connection, a detachable connection, an integral connection, a mechanical connection, an electrical connection, a direct connection, an indirect connection through an intermediate medium, and/or an internal communication between two components. The specific meanings of the above terms in the present disclosure can be understood by one of ordinary skill in the art on a case-by-case basis.

An array substrate 100 according to some embodiments of the present disclosure will be described below with reference to FIGS. 1 to 6.

As shown in FIGS. 1 to 6, the array substrate 100 according to embodiments of the present disclosure includes at least one capacitor 10, and each capacitor 10 includes a plurality of metal electrodes 1 arranged opposite to each other.

Figure 5:
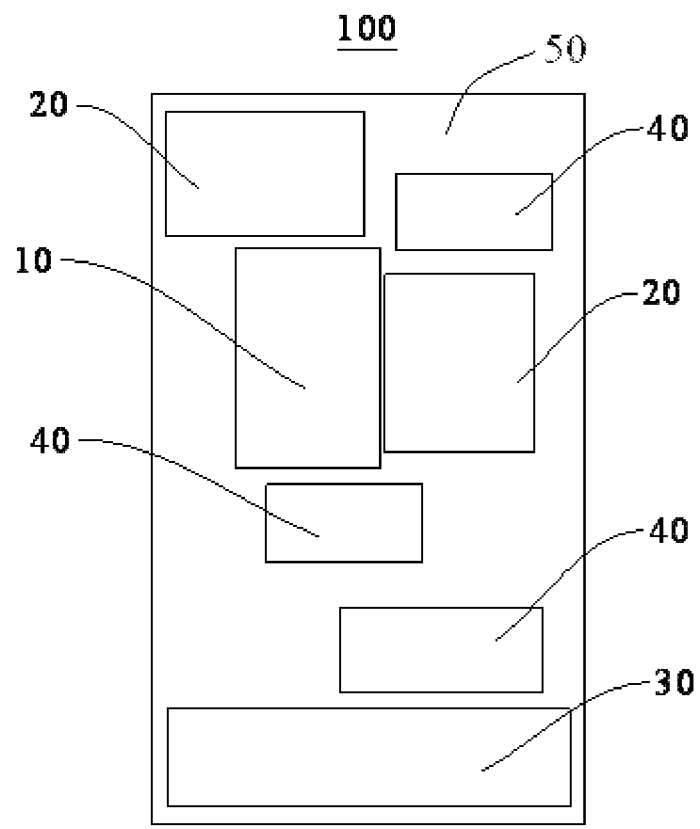
FIG. 5 is a schematic diagram showing an array substrate according to an embodiment of the present disclosure.

In an embodiment, the plurality of metal electrodes 1 are spaced apart from each other in a horizontal direction parallel to a plane in which the array substrate 100 is located, which is advantageous for ensuring the reliability and miniaturization of the array substrate 100. In an embodiment, the plurality of metal electrodes 1 are spaced apart from each other on a surface (e.g., an upper surface) of a base substrate 50 of the array substrate 100, as shown in FIG. 5.

It should be noted that, to ensure the reliability of the capacitor 10, any two adjacent metal electrodes 1 thereof may be provided with vacuum, a solid insulation material or an insulating gas therebetween, thereby ensuring the insulation effect between any two adjacent metal electrodes 1.

An orthogonal projection of each of at least two metal electrodes (e.g., a first metal electrode and a second metal electrode) 1 of the plurality of metal electrodes 1 of the capacitor 10 on the plane in which the array substrate 100 is located includes a curved portion 11. It can be seen therefrom that, in the array substrate 100 according to the embodiments of the present disclosure, since the orthogonal projection of each of the at least two metal electrodes 1 includes the curved portion 11, the array substrate 100 according to the embodiments of the present disclosure can increase an area by which any two adjacent metal electrodes 1 of the capacitor 10 overlap with each other (e.g., an area by which any two adjacent metal electrodes 1 of the capacitor 10 exactly face each other) as compared with the prior art. As a result, in a case where the space occupied by the capacitor 10 is constant, the capacitance of the capacitor 10 of the array substrate 100 can be increased. In other words, in a case where the capacitance of the capacitor 10 is constant, the space occupied by the capacitor 10 can be decreased effectively.

That is, compared with the prior art, the capacitor 10 of the array substrate 100 according to the embodiments of the present disclosure has a larger capacitance in a same layout space. In a case of having a same capacitance, the capacitor 10 of the array substrate 100 according to the embodiments of the present disclosure occupies a space smaller than that occupied by a capacitor in the prior art, which facilitates the miniaturization of the array substrate 100.

In the array substrate 100 according to the embodiments of the present disclosure, the orthogonal projection of each of at least two metal electrodes 1 on the plane in which the array substrate 100 is located includes the curved portion 11, thus an area by which the at least two metal electrodes 1 overlap with each other may be increased. In this way, the capacitance of the capacitor 10 of the array substrate 100 may be increased, which facilitates the reduction of the space occupied by the capacitor 10 and the miniaturization of the array substrate 100.

In some embodiments of the present disclosure, the capacitor 10 further includes at least one insulation layer 2, and any two adjacent metal electrodes 1 are spaced apart from each other by one of the at least one insulation layer 2. Thus, the capacitance and reliability of the capacitor 10 may be further increased, and the phenomenon of short circuit may be prevented from occurring between any two adjacent metal electrodes 1 effectively.

In an embodiment, the at least one insulation layer 2 has a same thickness, such that the capacitor 10 has a simplified structure, and any two adjacent metal electrodes 1 have a same distance therebetween at different positions, thereby increasing the reliability of the array substrate 100. Further, any two adjacent metal electrodes 1 at different positions in the capacitor 10 of the array substrate 100 have a same overlapping area, and form sub-capacitors having a same capacitance. It should be noted that, the thickness of each insulation layer 2 is equal to a distance between the two adjacent metal electrodes 1 spaced apart from each other by the insulation layer 2.

In an embodiment, a direction perpendicular to the plane in which the array substrate 100 is located is a lengthwise direction of the insulation layer 2 (as indicated by the double-arrow shown in FIGS. 2 and 4), and the insulation layer 2 has a length of about 2 um. It can be seen therefrom that, the capacitor 10 may have a length of about 2 um, and each metal electrode 1 may have a length of about 2 um, such that the capacitance of the capacitor 10 meets requirements while the space occupied by the capacitor 10 is small.

In an embodiment, the orthogonal projections of the at least two metal electrodes 1 (and the insulation layer 2 therebetween) of the capacitor 10 on the plane in which the array substrate 100 is located are configured to have spiral shapes, e.g., have conformal spiral shapes. In an embodiment, orthogonal projections of all of the metal electrodes 1 (and the insulation layers 2 therebetween) of the capacitor 10 on the plane in which the array substrate 100 is located are configured to have spiral shapes, e.g., have conformal spiral shapes. In this case, any two adjacent metal electrodes 1 of the capacitor 10 of the array substrate 100 are wound conformally and spirally, so that an area by which any two adjacent metal electrodes 1 overlap with each other is further increased, the space occupied by the capacitor 10 is used effectively, and the capacitance of the capacitor 10 of the array substrate 100 is increased effectively.

The number of the metal electrodes 1 of the capacitor 10 is not limited to two, and may be larger than two in an embodiment, to further increase areas by each of which any two adjacent metal electrodes 1 of the capacitor 10 of the array substrate 100 overlap with each other, thereby increasing the capacitance of the capacitor 10 of the array substrate 100. In a case where the number of the metal electrodes 1 of the capacitor 10 is larger than two, sub-capacitors each of which is formed by each pair of two adjacent metal electrodes 1 may be connected to each other in parallel, to form a whole capacitor (i.e., the capacitor 10).

Figure 3:
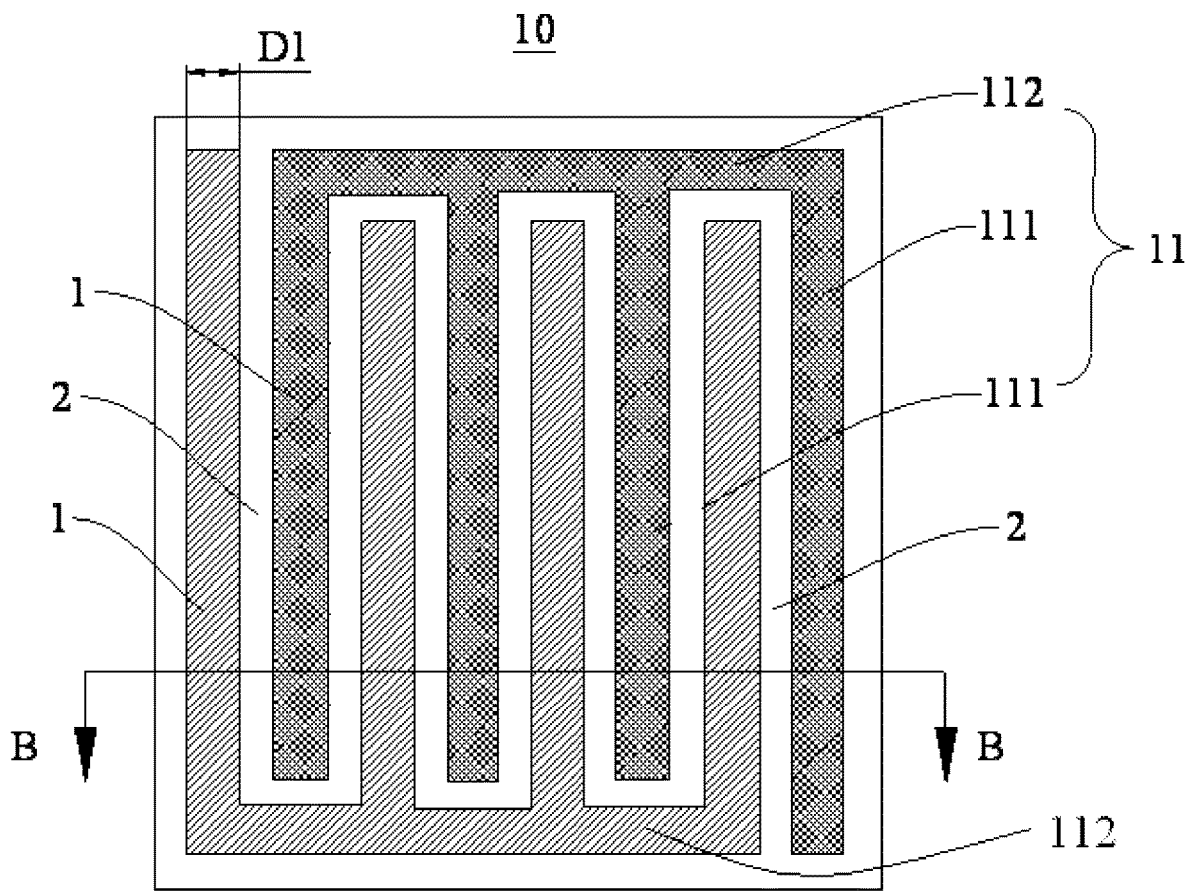
FIG. 3 is a schematic diagram showing a capacitor according to another embodiment of the present disclosure.

In an embodiment, the curved portion 11 includes a plurality of finger-shaped portions 111 spaced apart from each other and a connecting portion 112 for connecting any adjacent two of the plurality of finger-shaped portions 111 to each other, the number of the metal electrodes 1 is two, and the finger-shaped portions of the two metal electrodes 1 are arranged alternately, as shown in FIG. 3. In this case, it should be noted that each finger-shaped portion 111 and each connecting portion 112 of the curved portion 11 of each of the metal electrodes 1 having a spiral shape as shown in FIG. 1 may not be obviously distinguished from each other (i.e., may be identical to each other). The capacitor 10 may be of an interdigitated type, as shown in FIG. 3, such that the space occupied by the capacitor 10 is used effectively, and an area by which any two adjacent metal electrodes 1 overlap with each other is further increased. Thus, the capacitance of the capacitor 10 of the array substrate 100 is increased, and the space occupied by the capacitor 10 is decreased effectively.

In an embodiment, both each finger-shaped portion 111 and each connecting portion 112 are strip-shaped, e.g., are uniform strip-shaped, such that each of the metal electrodes 1 has a simplified structure and can be manufactured easily, which facilitates increasing the efficiency for manufacturing the capacitor 10 (and thus the array substrate 100).

In an embodiment, each of two finger-shaped portions 111 located at the outermost sides (e.g., the left and right sides as shown in FIG. 3) has the largest length, so as to be flush with an outer side (e.g., the upper or lower side as shown in FIG. 3) of the corresponding connecting portion 112. For example, in a horizontal direction parallel to a plane in which the array substrate 100 is located, an end of each of the finger-shaped portions 111 of a first metal electrode located inside of the capacitor 10 is connected to a corresponding connecting portion 112, and the other end thereof is inserted into a corresponding curved portion 11 of a second metal electrode. The connecting portions 112 and the finger-shaped portions 111 of one metal electrode 1 are separated from those of another metal electrode 1 by the insulation layer 2, thus the insulation layer 2 occupies a certain space. Since one end of each of finger-shaped portions 111 located at the outermost sides is connected to the corresponding connecting portion 112, and since the other end thereof is not inserted into any curved portion 11, each of two finger-shaped portions 111 located at the outermost sides has the largest length. Thus, the space occupied by the capacitor 10 is used effectively, and the capacitance of the capacitor 10 of the array substrate 100 is further increased.

For example, the direction parallel to the plane in which the array substrate 100 is located is a thickness-wise direction of each of the plurality of metal electrodes 1 (as indicated by the double-arrow shown in FIGS. 1 and 3), and the plurality of metal electrodes 1 have a same thickness. Thus, the capacitor 10 has a uniformly distributed structure, which facilitates improving the reliability of the array substrate 100.

In an embodiment, the plurality of metal electrodes 1 are formed by a single patterning process. After the plurality of metal electrodes 1 are formed, the insulation layer 2 is inserted between any two adjacent metal electrodes 1 to form the capacitor 10 of the array substrate 100. In this way, the capacitor 10 has a simplified structure and can be manufactured easily, and the efficiency for manufacturing the array substrate 100 can be increased to a large extent.

Figure 6:
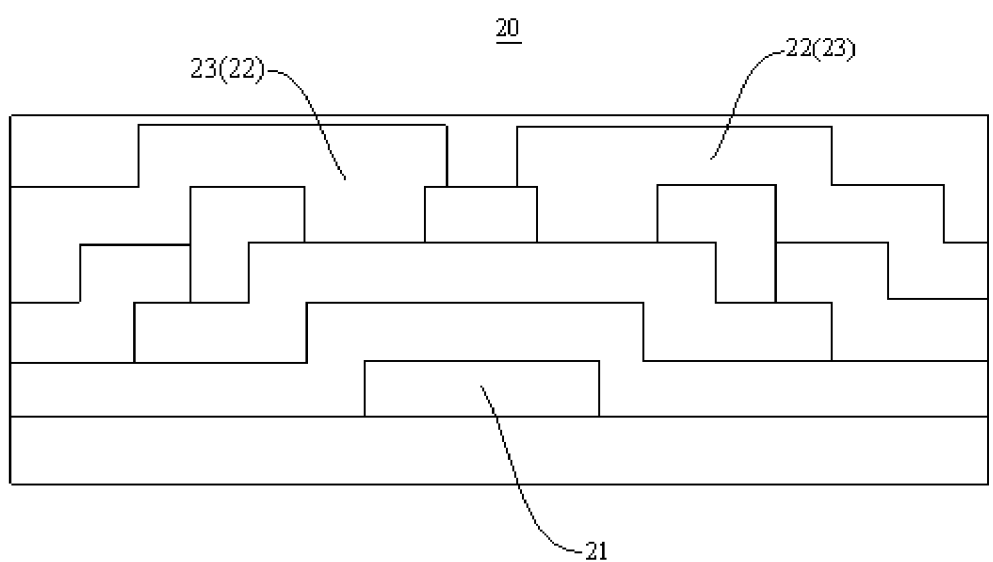
FIG. 6 is a schematic diagram showing a thin film transistor according to an embodiment of the present disclosure.

In an embodiment, the array substrate 100 further includes a thin film transistor 20 which includes a gate 21, and the gate 21 and the plurality of metal electrodes 1 of the at least one capacitor 10 are located in a same layer. In this way, the array substrate 100 may be manufactured easily, and the metal electrodes 1 and the gate 21 may be formed by a single patterning process, which facilitates increasing the efficiency for manufacturing the array substrate 100 and decreasing the cost for manufacturing the array substrate 100. For example, the thin film transistor 20 may be of a bottom-gate type, as shown in FIG. 6.

In a direction perpendicular to the plane in which the array substrate 100 is located, each of the metal electrodes 1 has a size larger than that of the gate 21. For example, array substrate 100 may be provided with two patterns having different sizes by a semi-exposure process, so that each of the metal electrodes 1 has a size larger than that of the gate 21, to increase an area by which any two adjacent metal electrodes 1 of the capacitor 10 overlap with each other, thereby increasing the capacitance of the capacitor 10 of the array substrate 100. It should be noted that, a size of the gate 21 and a size of each of the metal electrodes 1 may be set according to practical design requirements of the array substrate 100. For example, in the direction perpendicular to the plane in which the array substrate 100 is located, each of the metal electrodes 1 may have a size less than that of the gate 21, as long as the reliability of the array substrate 100 is ensured.

In an embodiment, the array substrate 100 further includes a thin film transistor 20 which includes a drain 22 and a source 23, and the drain 22 and/or the source 23 as well as the plurality of metal electrodes 1 of the at least one capacitor 10 are located in a same layer. In this way, the array substrate 100 may be manufacturing easily, and the metal electrodes 1 and the drain 22 and/or the source 23 may be formed by a single patterning process, which facilitates increasing the efficiency for manufacturing the array substrate 100 and decreasing the cost for manufacturing the array substrate 100. For example, the thin film transistor 20 may be of a top-gate type.

In the direction perpendicular to the plane in which the array substrate 100 is located, each of the metal electrodes 1 has a size larger than that of the drain 22 or the source 23. For example, the array substrate 100 may be provided with two patterns having different sizes by a semi-exposure process, so that each of the metal electrodes 1 has a size larger than that of the drain 22 or the source 23, to increase an area by which any two adjacent metal electrodes 1 of the capacitor 10 overlap with each other, thereby increasing the capacitance of the capacitor 10 of the array substrate 100. It should be noted that, a size of the drain 22 or the source 23 and a size of each of the metal electrodes 1 may be set according to practical design requirements of the array substrate 100. For example, in the direction perpendicular to the plane in which the array substrate 100 is located, each of the metal electrodes 1 may have a size less than that of the drain 22 or the source 23, as long as the reliability of the array substrate 100 is ensured.

In an embodiment, an orthogonal projection of the capacitor 10 on the plane in which the array substrate 100 is located has an area of S1, and a sum of all of areas by each of which any adjacent two of the plurality of metal electrodes 1 of the capacitor 10 overlap with each other is S2. In a case where S1<S2 is established, the capacitance of the capacitor 10 of the array substrate 100 can be increased effectively, which facilitates the miniaturization of the capacitor 10 and the array substrate 100. It should be noted that, the sum of all of areas described above means that, any pair of adjacent two of the plurality of metal electrodes 1 of the capacitor 10 has an overlapping area, and thus overlapping areas of all pairs of adjacent two of the plurality of metal electrodes 1 of the capacitor 10 should be summed up. Further, the relationship between the areas S1 and S2 is not limited thereto, as long as the reliability of the array substrate 100 is ensured.

In other words, in a case where any two adjacent metal electrodes 1 of the capacitor 10 are arranged opposite to each other and have the insulation layer 2 provided therebetween, an orthogonal projection of the capacitor 10 on the plane in which the array substrate 100 is located has an area S1, one of two opposite sides of any two adjacent metal electrodes 1 provided with the insulation layer 2 therebetween has an area S3, and a sum of areas of all pairs of adjacent two metal electrodes of the plurality of metal electrodes 1 provided with the insulation layers 2 therebetween is nS3, where S1<nS3, n is the number of the pairs of any adjacent two of the plurality of metal electrodes 1, and n is an integer not less than 1.

Figure 2:
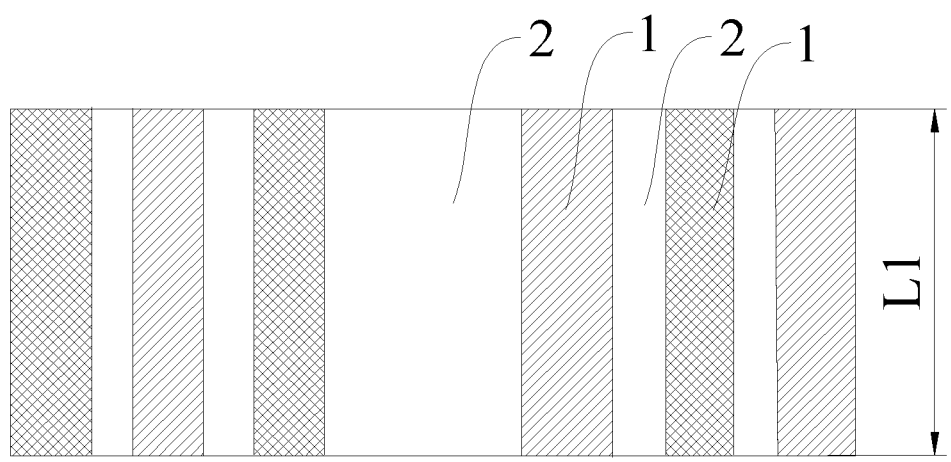
FIG. 2 is a schematic sectional view of the capacitor shown in FIG. 1 taken along the line A-A shown therein.
Figure 4:
FIG. 4 is a schematic sectional view of the capacitor shown in FIG. 3 taken along the line B-B shown therein.
Figure 4:
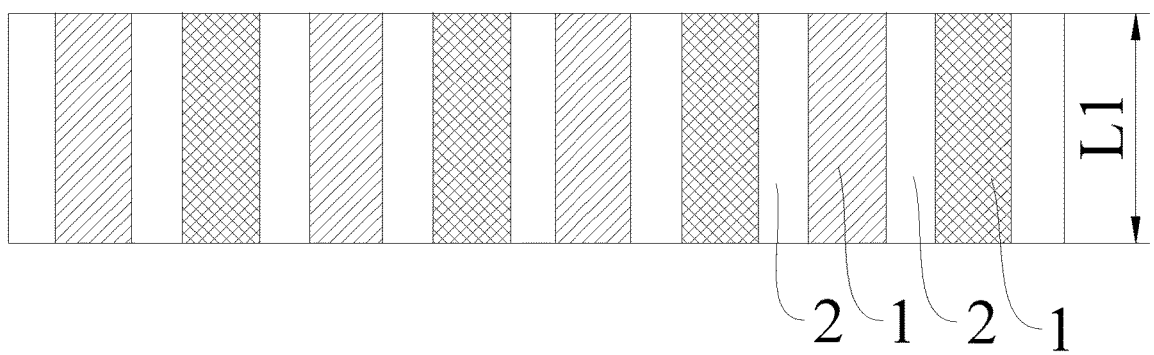

As described above, the direction parallel to the plane in which the array substrate 100 is located is a thickness-wise direction of each of the metal electrodes 1, and the direction perpendicular to the plane in which the array substrate 100 is located is a lengthwise direction of each of the metal electrodes. In an embodiment, each of the metal electrodes 1 has a thickness of D1 (as shown in FIGS. 1 and 3), and each of the metal electrodes 1 has a length of L1 (as shown in FIGS. 2 and 4). In a case where D1<L1 is established, the capacitance of the capacitor 10 of the array substrate 100 can be increased effectively, which facilitates the miniaturization of the capacitor 10 and the array substrate 100. It should be note that, a relationship between the sizes D1 and L1 is not limited thereto, as long as the reliability of the array substrate 100 is ensured.

In an embodiment, a light emitting region 30 and a via region 40 are provided on a surface (e.g., the upper surface) of the base substrate 50 of the array substrate 100, as shown in FIG. 5. The light emitting region 30 and the via region 40 may be known structures. For example, the light emitting region 30 may correspond to a region provided with a backlight assembly or a liquid crystal cell, and the via region 40 may be provided with a via for electrically connecting components on different layers to each other.

An embodiment of the present disclosure provides a display device (not shown), which includes the array substrate 100 provided by any one of the embodiments of the present disclosure.

By including the array substrate 100 provided by any one of the embodiments of the present disclosure, the display device according to the embodiment of the present disclosure can increase an area by which any two adjacent metal electrodes 1 of the capacitor 10 overlap with each other, and can increase the capacitance of the capacitor 10 of the array substrate 100, which facilitates decreasing the space occupied by the capacitor 10, and facilitates the miniaturization of the array substrate 100. As a result, an aperture ratio and a charging rate of the display device are increased.

An embodiment of the present disclosure provides a method for manufacturing the array substrate 100. The method includes a step of forming the capacitor 10, so that the capacitor 10 includes the plurality of metal electrodes 10 arranged opposite to each other, the plurality of metal electrodes are spaced apart from each other in the horizontal direction parallel to the plane in which the array substrate is located, and an orthogonal projection of each of at least two ones (e.g., a first metal electrode and a second metal electrode) of the plurality of metal electrodes 1 of the capacitor 10 on the plane in which the array substrate 100 is located includes the curved portion 11. For example, the capacitor 10 may be formed on a surface (e.g., the upper surface) of the base substrate 50 of the array substrate 100, as shown in FIG. 5.

The method for manufacturing the array substrate 100 according to the embodiment of the present disclosure can increase an area by which any two adjacent metal electrodes 1 of the capacitor 10 of the array substrate 100 overlap with each other, and can increase the capacitance of the capacitor 10 of the array substrate 100, which facilitates decreasing the space occupied by the capacitor 10, and facilitates the miniaturization of the array substrate 100. As a result, an aperture ratio and a charging rate of a display device including the array substrate 100 are increased.

In some embodiments of the present disclosure, the capacitor 10 further includes at least one insulation layer 2, and any adjacent two of the plurality of metal electrodes 1 are spaced apart from each other by one of the at least one insulation layer 2. In this way, the capacitance and reliability of the capacitor 10 can be further increased, and the phenomenon of shout circuit is prevented from occurring between any two adjacent metal electrodes 1 effectively.

In an embodiment, the step of forming the capacitor 10 may include the following steps S1A to S3A.

The step S1A includes forming a metal layer. For example, the metal layer may be formed on a surface (e.g., the upper surface) of the base substrate 50 of the array substrate 100.

The step S2A includes etching the metal layer to form the plurality of metal electrodes 1.

The step S3A includes forming the insulation layer 2 between any adjacent two of the plurality of metal electrodes 1.

In this way, in the array substrate 100 according to the embodiments of the present disclosure, each of the metal electrodes 1 may be formed prior to the formation of the insulation layer 2. Thus, the steps for forming the capacitor 10 are simple and reliable.

In an embodiment, the step S3A may include a step of coating an insulation material on each of the plurality of metal electrodes 1 to form the insulation layer 2. In this way, the insulation layer 2 may be formed simply and reliably, which facilitates increasing the efficiency for manufacturing the capacitor 10. For example, the insulation material may be coated on either or both of two opposite surfaces of any adjacent two of the plurality of metal electrodes 1.

Alternatively, in an embodiment, the step of forming the capacitor 10 may include the following steps S1B to S4B.

The step S1B includes forming the insulation layer 2. For example, the insulation layer 2 may be formed on a surface (e.g., the upper surface) of the base substrate 50 of the array substrate 100.

The step S2B includes etching the insulation layer 2 to form a groove. For example, two opposite sides of the insulation layer 2 may be etched to form two opposite grooves spaced apart from each other. That is, the two grooves are separated from each other by the insulation layer 2 without communicating to each other.

The step S3B includes forming a metal layer in the groove. For example, metal layers may be formed in the two opposite grooves of the insulation layer 2, respectively.

The step S4B includes removing metal outside the groove of the insulation layer 2 to form each of the metal electrodes 1. For example, metals outside the two grooves of the insulation layer 2 are removed to form two adjacent metal electrodes 1 spaced apart from each other by the insulation layer 2.

In this way, in the array substrate 100 according to the embodiments of the present disclosure, the insulation layer 2 may be formed prior to the formation of the metal electrodes 1. Thus, the steps for forming the capacitor 10 may be simple and reliable.

In an embodiment, the step S3B may include depositing a metal in the groove. Thus, the metal layer may be formed simply.

In an embodiment, the step S4B may include removing metal outside the groove of the insulation layer 2 by a grinding process to form each of the metal electrodes 1. Thus, the reliability of the capacitor 10 is ensured, and short circuit is prevented from occurring between any two adjacent metal electrodes 1.

In an embodiment, each of at least two metal electrodes 1 of the capacitor 10 is formed to have an orthogonal projection having a spiral shape on the plane in which the array substrate 100 is located. In an embodiment, all of the metal electrodes 1 of the capacitor 10 are formed to have orthogonal projections having spiral shapes on the plane in which the array substrate 100 is located, respectively. In this way, in the array substrate 100, any two adjacent metal electrodes 1 are wound conformally and spirally, which can further increase an area by which any two adjacent metal electrodes 1 overlap with each other, use the space occupied by the capacitor 10 effectively, and increase the capacitance of the capacitor 10 of the array substrate 100.

In an embodiment, each curved portion 11 is formed to include two finger-shaped portions 111 spaced apart from each other and a connecting portion 112 for connecting the two finger-shaped portions 111 to each other, the number of metal electrodes 1 may be two, and the finger-shaped portions 111 of the two metal electrodes 1 may be arranged alternately. In this way, the capacitor 10 is formed to be of an interdigitated type, and the space occupied by the capacitor 10 can be used effectively, which further increases an area by which any two adjacent metal electrodes 1 overlap with each other, increases the capacitance of the capacitor 10 of the array substrate 100, and decreases the space occupied by the capacitor 10 effectively.

The method for manufacturing the array substrate 100 according to the embodiments of the present disclosure will be further described below with reference to FIGS. 1 to 6. It should be noted that, the description below is merely illustrative, it will be obvious to one of ordinary skill in the art to make combination, replacement and modification to all of the technical solutions described herein or to some of the technical features thereof after reading the technical solutions, and such combination, replacement and modification also fall within the protection scope of the present disclosure.

As shown in FIGS. 1 to 6, the method for manufacturing the array substrate 100 according to the embodiment of the present disclosure may further include a step of forming another capacitor 10, a thin film transistor 20, a light emitting region 30 and a via region 40 on a surface (e.g., the upper surface) of the base substrate 50 of the array substrate 100.

In an embodiment, two capacitors 10 are formed on the array substrate 100. The two capacitors 10 are spaced apart from each other in the direction perpendicular to the plane in which the array substrate 100 is located, and each of the capacitors 10 includes two metal electrodes 1 and one insulation layer 2 provided between the two metal electrodes 1.

In an embodiment, the two metal electrodes 1 of each of the capacitors 10 have a same thickness and are formed by a single patterning process, and are spaced apart from each other by the insulation layer 2. The direction perpendicular to the plane in which the array substrate 100 is located is a lengthwise direction of the insulation layer 2, and the insulation layer 2 has a length of about 2 um. In the direction parallel to the plane in which the array substrate 100 is located, the two metal electrodes 1 and the insulation layer 2 extend conformally and spirally to form the capacitor 10 having a spiral shape.

In an embodiment, the thin film transistor 20 includes a gate 21, a drain 22 and a source 23. In the direction perpendicular to the plane in which the array substrate 100 is located, the gate 21 may be located below the drain 22 and the source 23 (i.e., the thin film transistor 20 is of a bottom-gate type), but the present disclosure is not limited thereto.

In an embodiment, the gate 21 and the two metal electrodes 1 of one of the two capacitor 10 may be formed by a single patterning process, so that in the direction perpendicular to the plane in which the array substrate 100 is located, each of the metal electrodes 1 has a size larger than that of the gate 21, so as to increase an area by which the two metal electrodes 1 overlap with each other. The capacitor 10 may have a capacitance C1.

The drain 22 and the source 23 as well as the other of the two capacitor 10 may be formed by a single patterning process, so that in the direction perpendicular to the plane in which the array substrate 100 is located, each of the metal electrodes 1 has a size larger than that of the drain 22 or the source 23. The capacitor 10 may have a capacitance C2. The metal electrodes 1 of the two capacitors 10 may generate a parasitic capacitance C3 therebetween.

An orthogonal projection of each capacitor 10 on the plane in which the array substrate 100 is located has an area S1, and an area by which the two metal electrodes 1 of the capacitor 10 overlap with each other is S2, where S1<S2.

As described above, the direction parallel to the plane in which the array substrate 100 is located is the thickness-wise direction of each of the metal electrodes 1 (as shown in FIGS. 1 and 3), the direction perpendicular to the plane in which the array substrate 100 is located is the lengthwise direction of each of the metal electrodes 1 (as shown in FIGS. 2 and 4), and each of the metal electrodes has a thickness of D1 and a length of L1, where D1<L1. With such a configuration, an area by which the two metal electrodes 1 of each capacitor 10 overlap with each other can be increased, and the capacitance of the capacitor 10 can be increased effectively.

Other components of the array substrate 100 according to the embodiments of the present disclosure and their operations may be known to one of ordinary skill in the art, and detailed description thereof is omitted herein.

In the description of the present disclosure, the description with reference to the terms "an embodiment", "some embodiments", "illustrative embodiment", "example", "specific example", "some examples", or the like means that particular features, structures, materials or characteristics described in conjunction with the embodiment or example are included in at least one embodiment or example of the present disclosure. In the present disclosure, the schematic representation of the above terms does not necessarily refer to a same embodiment or example. Furthermore, the particular features, structures, materials, or characteristics described may be combined in a suitable manner in any one or more embodiments or examples.

While the foregoing embodiments of the present disclosure have been illustrated and described, it would be understood by one of ordinary skill in the art that various improvements and modifications may be made thereto without departing from the principle and essence of the present disclosure. The scope of the present disclosure is defined by the claims and their equivalents.

What is claimed is:

1. An array substrate, comprising
an insulation layer having a plurality of grooves therein, wherein any adjacent two of the plurality of grooves are spaced apart from each other and are not in communication with each other; and
a plurality of metal electrodes located in the plurality of grooves, respectively;
wherein the insulation layer and the plurality of metal electrodes form a capacitor, the plurality of metal electrodes of the capacitor are arranged opposite to each other, the plurality of metal electrodes are spaced apart from each other in a horizontal direction parallel to a plane in which the array substrate is located, and an orthogonal projection of each of at least two of the plurality of metal electrodes of the capacitor on the plane in which the array substrate is located comprises a curved portion; and
the array substrate further comprises a thin film transistor which comprises a gate, wherein the gate and the plurality of metal electrodes of the capacitor are located in a same layer, and in a direction perpendicular to the plane in which the array substrate is located, each of the plurality of metal electrodes has a size larger than that of the gate.

2. The array substrate according to claim 1, wherein orthogonal projections of the at least two of the plurality of metal electrodes of the capacitor on the plane in which the array substrate is located have spiral shapes.

3. The array substrate according to claim 2, wherein the orthogonal projections of the at least two of the plurality of metal electrodes of the capacitor on the plane in which the array substrate is located have conformal spiral shapes.

4. The array substrate according to claim 1, wherein the curved portion comprises a plurality of finger-shaped portions spaced apart from each other and a connecting portion for connecting any adjacent two of the plurality of finger-shaped portions to each other, the at least two metal electrodes comprise a first metal electrode and a second metal electrode, and the plurality of finger-shaped portions of the first metal electrode and the plurality of finger-shaped portions of the second metal electrode are arranged alternately.

5. The array substrate according to claim 4, wherein both each of the plurality of finger-shaped portions and each connecting portion are strip-shaped.

6. The array substrate according to claim 1, wherein an orthogonal projection of the capacitor on the plane in which the array substrate is located has an area of S1, and a sum of all of areas by each of which two opposite sides, which are proximal to each other, of any adjacent two of the plurality of metal electrodes of the capacitor overlap with each other is S2, where S1<S2.

7. The array substrate according to claim 1, wherein a direction parallel to the plane in which the array substrate is located is a thickness-wise direction of each of the metal electrodes, a direction perpendicular to the plane in which the array substrate is located is a lengthwise direction of each of the metal electrodes, each of the metal electrodes has a thickness of D1, and each of the metal electrodes has a length of L1, where D1<L1.

8. The array substrate according to claim 1, wherein sub-capacitors each of which is formed by any adjacent two of the plurality of metal electrodes of the capacitor are connected in parallel in a cross-sectional view.

9. A display device, comprising the array substrate according to claim 1.

10. An array substrate, comprising
an insulation layer having a plurality of grooves therein, wherein any adjacent two of the plurality of grooves are spaced apart from each other and are not in communication with each other; and
a plurality of metal electrodes located in the plurality of grooves, respectively;
wherein the insulation layer and the plurality of metal electrodes form a capacitator, the plurality of metal electrodes of the capacitor are arranged opposite to each other, the plurality of metal electrodes are spaced apart from each other in a horizontal direction parallel to a plane in which the array substrate is located, and an orthogonal projection of each of at least two of the plurality of metal electrodes of the capacitator on the plane in which the array substrate is located comprises a curved position; and
the array substrate further comprises a thin film transistor which comprises a drain and a source, wherein the drain and/or source and the plurality of metal electrodes of the capacitor are located in a same layer, and in a direction perpendicular to the plane in which the array substrate is located, each of the plurality of metal electrodes has a size larger than that of the drain or the source.

11. The array substrate according to claim 10, wherein orthogonal projections of the at least two of the plurality of metal electrodes of the capacitor on the plane in which the array substrate is located have spiral shapes.

12. The array substrate according to claim 11, wherein the orthogonal projections of the at least two of the plurality of metal electrodes of the capacitor on the plane in which the array substrate is located have conformal spiral shapes.

13. The array substrate according to claim 10, wherein an orthogonal projection of the capacitor on the plane in which the array substrate is located has an area of S1, and a sum of all of areas by each of which two opposite sides, which are proximal to each other, of any adjacent two of the plurality of metal electrodes of the capacitor overlap with each other is S2, where S1<S2.

14. The array substrate according to claim 10, wherein a direction parallel to the plane in which the array substrate is located is a thickness-wise direction of each of the metal electrodes, a direction perpendicular to the plane in which the array substrate is located is a lengthwise direction of each of the metal electrodes, each of the metal electrodes has a thickness of D1, and each of the metal electrodes has a length of L1, where D1<L1.

15. The array substrate according to claim 10, wherein sub-capacitors each of which is formed by any adjacent two of the plurality of metal electrodes of the capacitor are connected in parallel in a cross-sectional view.

16. A display device, comprising the array substrate according to claim 10.

17. A method for manufacturing an array substrate, comprising a step of
forming a capacitor, so that the capacitor comprises a plurality of metal electrodes arranged opposite to each other, the plurality of metal electrodes are spaced apart from each other in a horizontal direction parallel to a plane in which the array substrate is located, and an orthogonal projection of each of at least two of the plurality of metal electrodes of the capacitor on the plane in which the array substrate is located comprises a curved portion;
wherein the capacitor further comprises an insulation layer, and any adjacent two of the plurality of metal electrodes are spaced apart from each other by the insulation layer; and
wherein the step of forming a capacitor comprises:
a step S1B of forming the insulation layer;
a step S2B of etching the insulation layer to form a groove;
a step S3B of forming a metal layer in the groove; and
a step S4B of removing a portion of the metal layer that is located outside of the groove to form each of the metal electrodes.

18. The method according to claim 17, wherein the step S2B comprises etching two opposite sides of the insulation layer to form two opposite grooves spaced apart from each other.

19. The method according to claim 17, wherein the step S3B comprises forming metal layers in two opposite grooves of the insulation layer, respectively.

20. The method according to claim 17, wherein the step S4B comprises removing a portion of the metal layer that is located outside of each of two opposite grooves of the insulation layer to form two adjacent metal electrodes spaced apart from each other by the insulation layer.

* * * * *